United States Patent
Hanya et al.

(10) Patent No.: US 10,730,433 B2
(45) Date of Patent: Aug. 4, 2020

(54) VISUAL LINE GUIDANCE SHEET, VISUAL LINE GUIDANCE SYSTEM, VEHICLE LIGHTING APPARATUS, AND VEHICLE

(71) Applicant: STANLEY ELECTRIC CO., LTD., Meguro-ku, Tokyo (JP)

(72) Inventors: Akihiko Hanya, Tokyo (JP); Toshihiko Minoda, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/360,089

(22) Filed: Mar. 21, 2019

(65) Prior Publication Data

US 2019/0291640 A1    Sep. 26, 2019

(30) Foreign Application Priority Data

Mar. 26, 2018   (JP) ................. 2018-057463

(51) Int. Cl.
| | |
|---|---|
| *B60Q 9/00* | (2006.01) |
| *B60Q 1/04* | (2006.01) |
| *H01L 33/62* | (2010.01) |
| *H01L 25/075* | (2006.01) |
| *H05B 45/10* | (2020.01) |

(52) U.S. Cl.
CPC ............. *B60Q 9/00* (2013.01); *B60Q 1/04* (2013.01); *H01L 25/0753* (2013.01); *H01L 33/62* (2013.01); *H05B 45/10* (2020.01)

(58) Field of Classification Search
CPC .......... B60Q 9/00; B60Q 9/005; B60Q 9/006; B60Q 9/007; B60Q 9/008; H01L 33/62; H01L 25/0753

USPC ..... 340/425.5, 435, 436, 438, 439, 457, 576
See application file for complete search history.

(56) References Cited

U.S. PATENT DOCUMENTS

| | | | | |
|---|---|---|---|---|
| 10,049,580 | B1* | 8/2018 | Wu | G08G 1/166 |
| 10,109,200 | B1* | 10/2018 | Delorme | G08G 1/166 |
| 2003/0141452 | A1* | 7/2003 | Musiel | G02B 23/12 |
| | | | | 250/330 |
| 2010/0253600 | A1* | 10/2010 | Seder | B32B 17/10036 |
| | | | | 345/7 |
| 2014/0002252 | A1* | 1/2014 | Fong | B60Q 9/008 |
| | | | | 340/435 |

(Continued)

FOREIGN PATENT DOCUMENTS

| | | | | |
|---|---|---|---|---|
| JP | 2013068895 | A * | 4/2013 | ........ G02F 1/1333 |
| JP | 2013068895 | A | 4/2013 | |

(Continued)

*Primary Examiner* — Hung T Nguyen
(74) *Attorney, Agent, or Firm* — Holtz, Holtz & Volek PC

(57) ABSTRACT

Provided is a sheet for drawing user's eyes and guiding the line of sight. A visual line guidance sheet is arranged to cover at least a part of a window for a user to look out therethrough, and configured to guide the user's line of sight, by illuminating a partial region on the visual line guidance sheet. The visual line guidance sheet includes an optically transparent substrate layer, a plurality of LED dies, and a wiring pattern. The controller receives from an imager, an image obtained by imaging a region visible by the user through the window, detects an object targeted for visual line guidance, included in the image, and illuminates the LED dies on the visual line guidance sheet, corresponding to a position of the object.

20 Claims, 12 Drawing Sheets

(56) References Cited

U.S. PATENT DOCUMENTS

| | | | | |
|---|---|---|---|---|
| 2014/0132407 A1* | 5/2014 | Kumai | ................ | G08G 1/0962 |
| | | | | 340/439 |
| 2017/0310743 A1* | 10/2017 | Aoyama | ............. | H04L 27/2602 |
| 2018/0147990 A1* | 5/2018 | Salter | ...................... | B60R 1/001 |

FOREIGN PATENT DOCUMENTS

| | | | | |
|---|---|---|---|---|
| JP | 2016196773 A | * | 11/2016 | ............. E01F 9/615 |
| JP | 2016196773 A | | 11/2016 | |

* cited by examiner

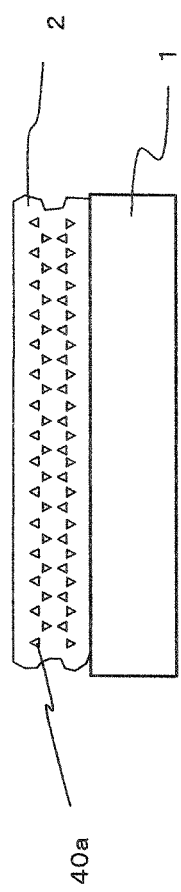

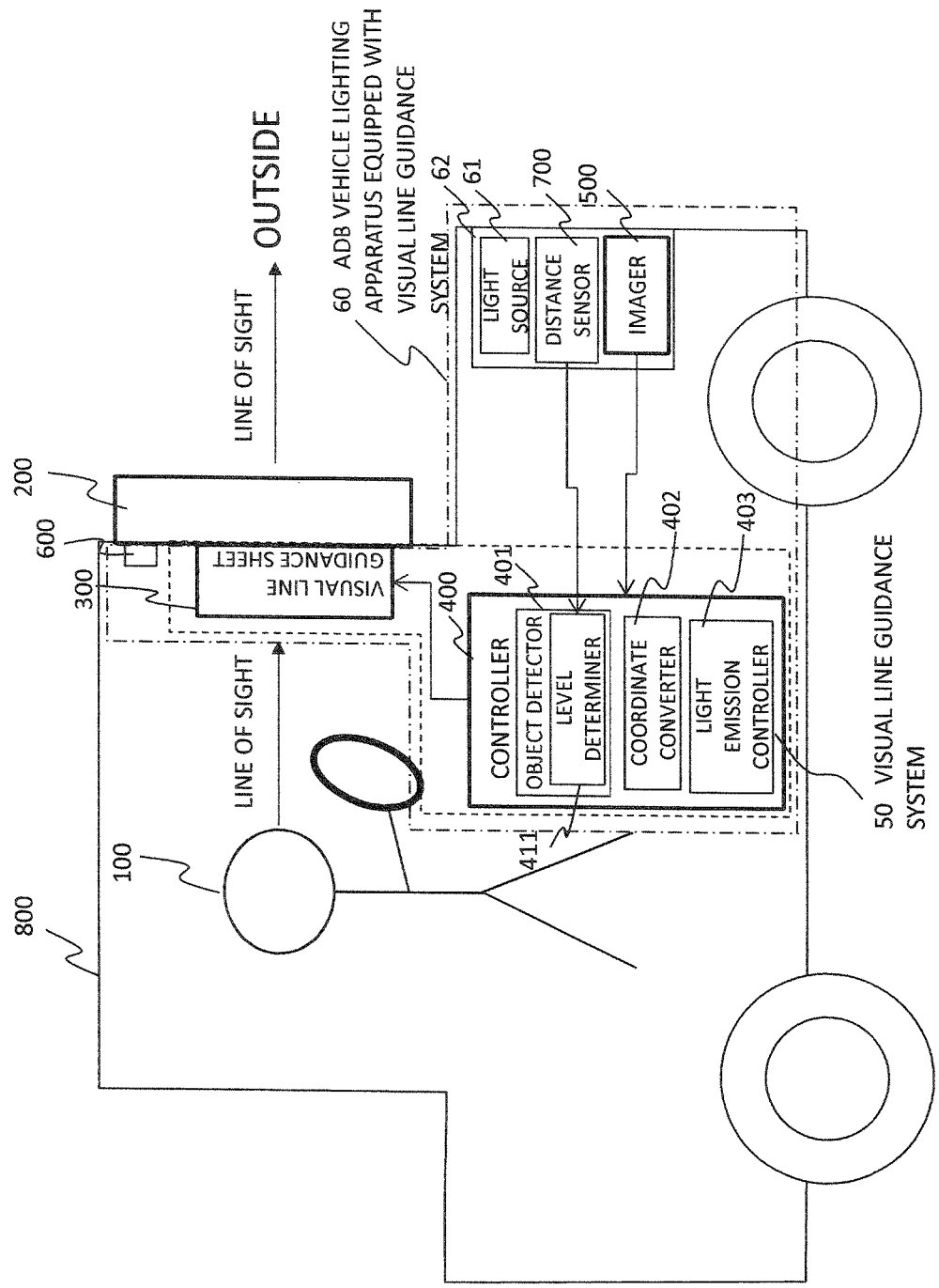

VISUAL LINE GUIDANCE SHEET, VISUAL LINE GUIDANCE SYSTEM, VEHICLE LIGHTING APPARATUS, AND VEHICLE

FIELD OF THE INVENTION

The present invention relates to a system configured to guide a user's line of sight.

DESCRIPTION OF THE RELATED ART

Display units such as road signs, automotive license plates, and liquid crystal display (LCD) panels are used widely, featuring a display that appeals to vision. Such a display unit has been contrived to improve visibility of a view. For the case of the LCD panel, its structure and display contents are contrived to enhance visibility, and for the case of the road sign, there is employed a structure where the sign is illuminated entirely by light at night, and this allows enhancement of visibility. Specifically, Japanese Unexamined Patent Application Publication No. 2013-068895 (hereinafter, referred to as patent document 1) suggests a structure where a peripheral end of an LCD panel is slanted to prevent a shiny appearance of a glass substrate edge, together with preventing deterioration of displaying quality. Japanese Unexamined Patent Application Publication No. 2016-196773 (hereinafter, referred to as patent document 2) discloses a signpost luminator where a lighting unit is installed on an upper part of the signpost, illuminating the entire display surface, and brightness of the illumination on the sign is increased in the event of a disaster.

In the LCD panel, however, since light intensity of each pixel is low, it is difficult to avoid deterioration of visibility in backlight, even with contrived display contents for visibility enhancement. As for the signpost, usually the sign is illuminated entirely during nighttime, but this display is likely to become obscured due to reflection or scattering of light, and this hampers visibility enhancement.

SUMMARY OF THE INVENTION

An objective of the present invention is to provide a visual line guidance sheet that draws user's eyes, and guides the line of sight.

In order to achieve the objective above, the present invention provides a visual line guidance sheet arranged to cover at least a part of a window for a user to look out therethrough, and the visual line guidance sheet is configured to guide the user's line of sight. The visual line guidance sheet comprises an optical transparency substrate layer, a plurality of LED dies mounted on the optical transparency substrate layer, and a wiring pattern provided on a surface of the optical transparency substrate layer and bonded to the LED dies.

According to the present invention, the visual line guidance sheet can be provided for drawing the user's eyes and guiding his or her line of sight, and this allows enhancement of visibility of an object such as a hazardous object.

BRIEF DESCRIPTION OF THE DRAWINGS

FIG. 2A shows light is off and FIG. 2B shows light is on;

FIG. 8 is a cross-sectional view showing pores in the wiring pattern according to the first embodiment;

FIG. 9 is a block diagram showing a vehicle lighting apparatus incorporating the visual line guidance system according to a second embodiment;

FIG. 12A shows light is off and FIG. 12B shows light is on.

DESCRIPTION OF THE PREFERRED EMBODIMENTS

There will now be described one embodiment of the present invention with reference to the accompanying drawings.

First Embodiment

A visual line guidance system of the first embodiment will be described with reference to the figures including FIG. 1.

Figure 1:
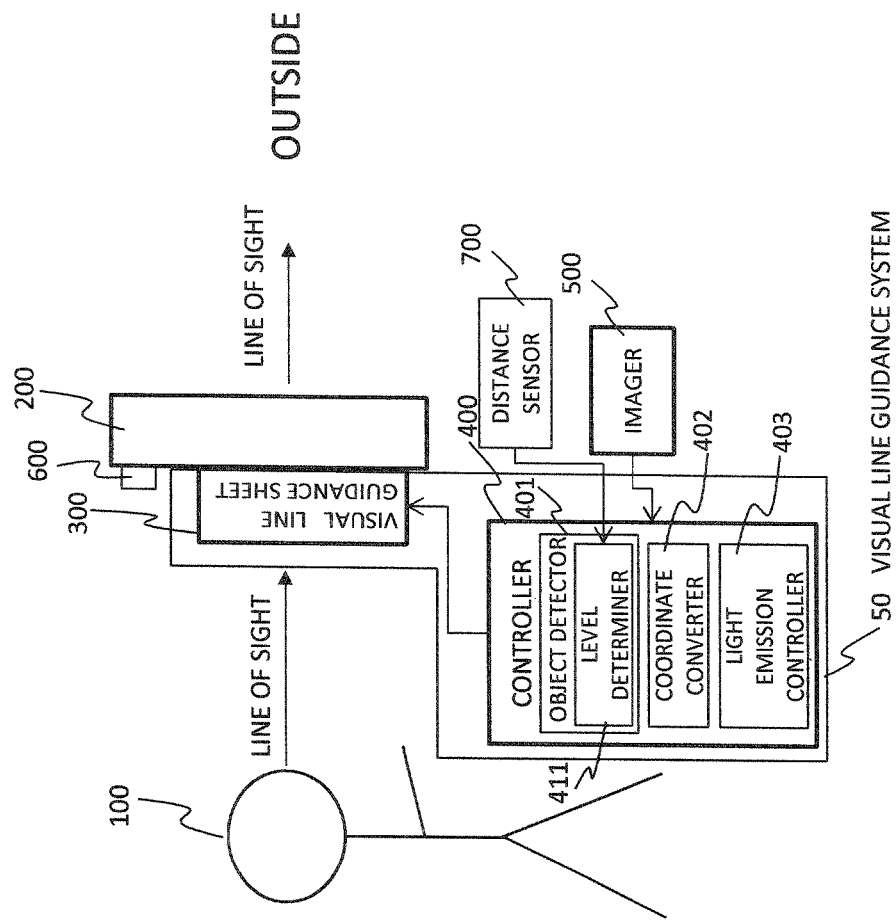
FIG. 1 is a block diagram showing a visual line guidance system of a first embodiment.
Figure 2:
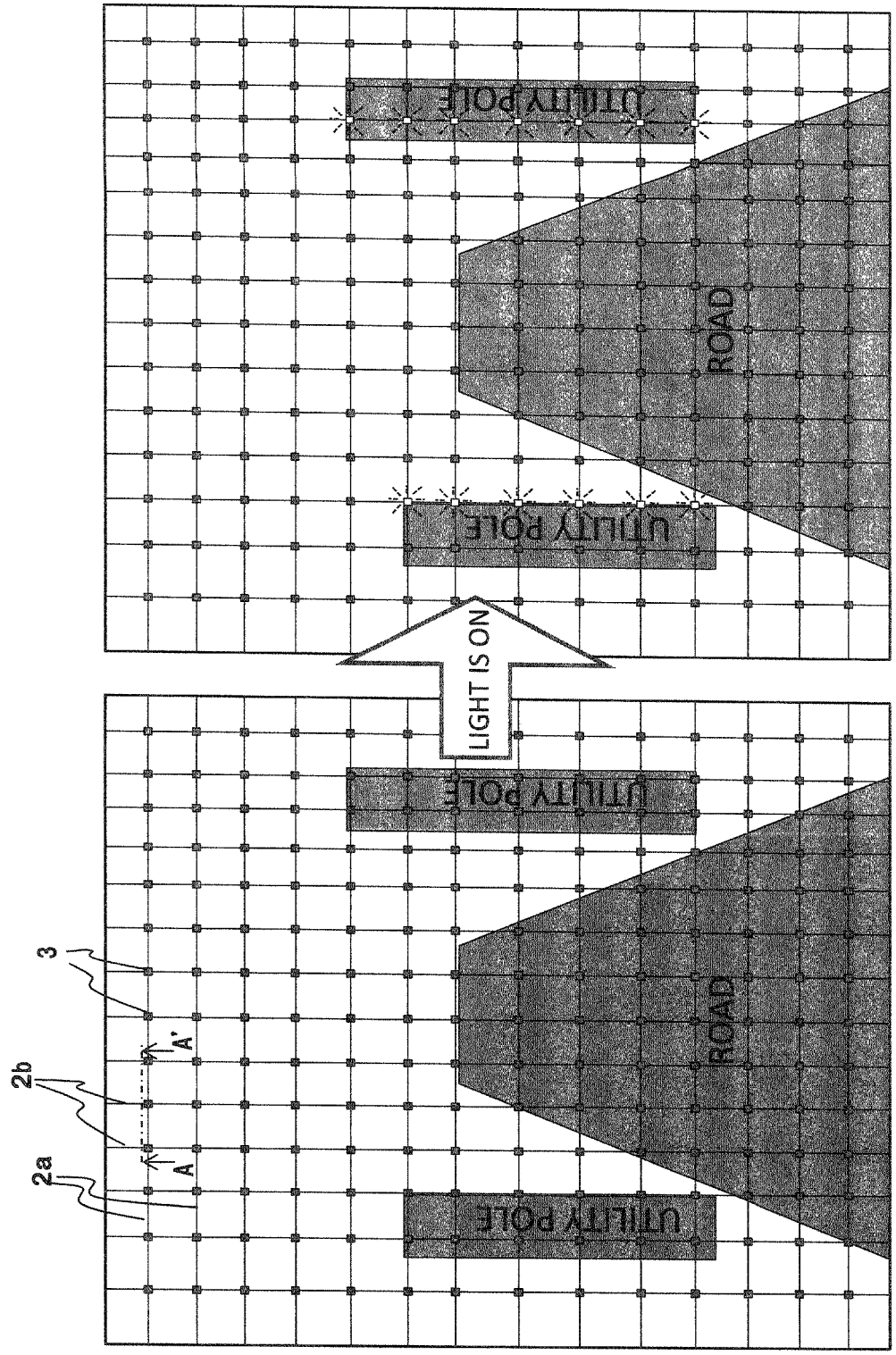
FIGS. 2A and 2B are front views showing a configuration of a visual line guidance sheet in the visual line guidance system according to the first embodiment.

As shown in FIG. 1, the visual line guidance system 50 of the present embodiment comprises a visual line guidance sheet 300 and a controller 400. The visual line guidance sheet 300 is arranged to cover at least a part of a window 200 such as a window for a user 100 to look out therethrough and a windshield (see FIG. 2A), and as shown in FIG. 2B, a partial region emits light to guide the user's line of sight. The controller 400 controls the light emitting region on the visual line guidance sheet 300.

Figure 3:
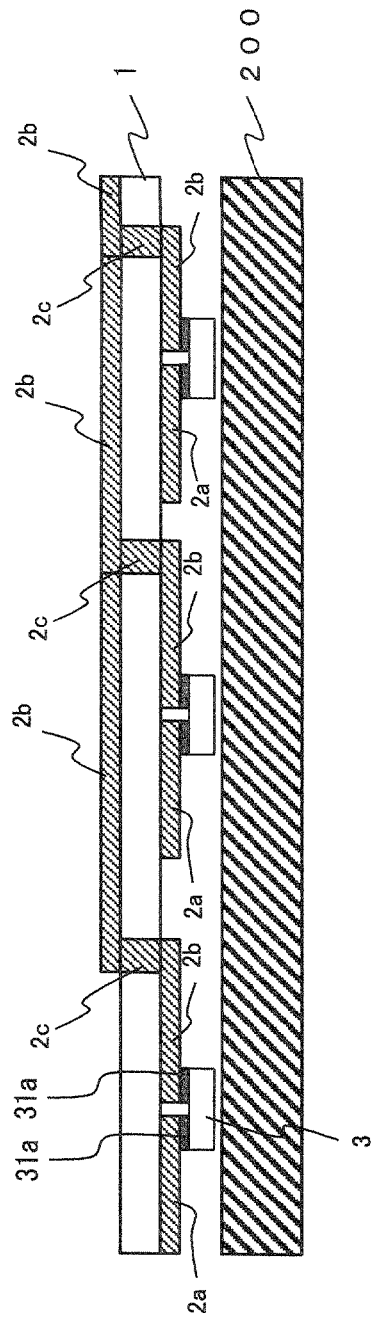
FIG. 3 is a cross sectional view, taken along line A-A' in FIG. 2A.

As illustrated in FIGS. 2A and 2B showing front views and in FIG. 3 showing a cross sectional view, the visual line guidance sheet 300 comprises an optically transparent substrate layer 1, a plurality of LED dies 3 mounted on the optically transparent substrate layer 1, and the wiring pattern 2. The wiring pattern 2 is provided on the surface of the optically transparent substrate layer 1, and it is bonded to the LED dies 3. The wiring patterns 2a, 2b, and 2c (hereinafter, the wiring patterns 2a, 2b, and 2c may also be referred to as "wiring pattern 2" collectively) are obtained by sintering of conductive particles. The LED dies 3 are bonded to the wiring pattern 2 via electrodes 31a of the LED dies 3.

By way of example, conductive particles are irradiated with electromagnetic waves and sintered, thereby forming the wiring pattern 2. The electromagnetic wave in this example here may have any wavelength range of the followings; ultraviolet light, visible light, infrared light, and a microwave.

As described above, the wiring pattern 2 is made of a material obtained by sintering of conductive particles. Accordingly, electromagnetic waves, for example, are focused on and applied to the wiring-pattern forming part and its joint part, and this allows formation of the wiring pattern 2. With this configuration, the wiring pattern 2 can be formed of wiring with a high thickness-to-width ratio (aspect ratio), i.e., with a small line-width and low electrical resistance.

The wiring pattern 2 of the present embodiment should not be limited to the wiring pattern formed by sintering of the conductive particles, but it may be formed by adhering thin lines made of a conductive material such as copper foil.

The size of an unpackaged LED die 3 should be of the order of micrometers. Accordingly, this allows production of the visual line guidance sheet 300 with a small area of the wiring pattern 2 and the LED dies 3, which shields the optically transparent substrate layer 1, and even when the visual line guidance sheet is arranged to cover the window 200, visibility of the user 100 is not reduced while looking outside. In addition, the LED dies 3 in a specific region emit light, thereby drawing the user's eyes to the specific region.

As shown in FIG. 1, the controller 400 comprises an object detector 401, the coordinate converter 402, and a light emission controller 403.

The object detector 401 receives from an imager 500 being connected, an image of the region (field of view as shown in FIG. 2A) that is visible by the user 100 through the window, and processes thus received image. This allows detection of a predetermined object targeted for visual line guidance included in the image. The object targeted for visual line guidance may be, for example, a pedestrian, an oncoming vehicle, a vehicle traveling ahead, and an obstacle such as a utility pole.

The coordinate converter 402 obtains a region on the visual line guidance sheet 300, corresponding to the position of the object in the image. The light emission controller 403 emits light from the LED dies 3 placed within thus obtained region on the visual line guidance sheet 300.

Since the optically transparent substrate layer 1 has high optical transparency, the light emitted from the LED dies 3 reaches the user 100 when the LED dies 3 illuminate. Then, brightness, color, and so on, of the light emitted from the LED dies 3 can draw the user's eyes. By way of example, as shown in FIG. 2B, when light is emitted from the LED dies 3 within the region of the utility pole, the eyes of the user 100 are drawn to the region where the LED dies 3 illuminate, and this allows the user to become aware of the presence of the utility pole. Therefore, in the case where the user drives a vehicle and the window 200 corresponds to a windshield, the user can recognize the presence of the utility pole, allowing the user to pay attention to avoid collision of the vehicle against the utility pole. With the configuration, the visual line guidance system 50 of the present embodiment can provide driving assistance to the user.

As shown in FIGS. 2A and 2B, in the visual line guidance sheet 300 of the present embodiment, there are arranged a plurality of LED dies 3, spaced vertically and horizontally (in a matrix). By emitting light from the LED dies at desired points, the line of sight can be guided to an object at a desired position.

Figure 4:
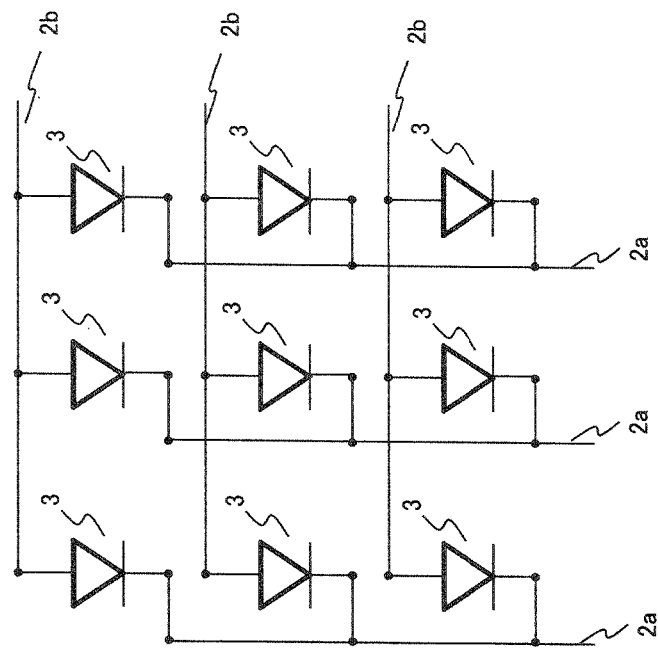
FIG. 4 is a circuit diagram showing LED dies and wiring patterns of the visual line guidance sheet according to the first embodiment.

The wiring pattern 2 is made up of the wiring patterns 2a in the vertical direction and the wiring patterns 2b in the horizontal direction, and light is emitted from at least any one of the LED dies 3 arranged in the matrix. The LED die 3 is placed at an intersection of the vertical wiring pattern 2a and the horizontal wiring pattern 2b, or in proximity to the intersection, and a plurality of LED dies 3 can be supplied with current individually. As shown in FIG. 3, for example, the vertical wiring patterns 2a are mainly arranged on the surface on one side of the optically transparent substrate layer 1, and the horizontal wiring patterns 2b are mainly arranged on the surface on the other side of the optically transparent substrate layer 1. The wiring pattern 2b provided on the optically transparent substrate layer 1, on the surface opposite to the surface where the LED die 3 is mounted, is pulled out from a via 2c formed through the optically transparent substrate layer 1, to the proximity of the LED die 3, and then connected to an electrode 31a of the LED die 3. The wiring pattern 2a provided on the optically transparent substrate layer 1, on the surface where the LED die 3 is mounted, is directly connected to the other electrode 31a of the LED die 3. This configuration forms a matrix circuit as shown in FIG. 4, allowing the LED dies 3 to illuminate individually.

As described above, the LED dies 3 are arranged in the matrix, and a desired LED die 3 is selectively ready for illumination. Therefore, even in the case where views outside the window 200 are ever-changing, for instance, while traveling of a vehicle the user drives, visibility can be enhanced by illuminating the LED dies 3 at the points corresponding to the position of the object targeted for visual line guidance.

FIG. 3 shows an example that the visual line guidance sheet 300 provided with the LED dies 3 facing the window 200, is placed in a manner that covers the window 200. On the other hand, it may also be configured such that the optically transparent substrate layer 1 of the visual line guidance sheet 300 faces the window 200. In order to protect the LED dies 3, a protective layer may be placed on the LED dies 3 on the optically transparent substrate layer 1. The visual line guidance sheet 300 may also be provided to cover the outer surface of the window 200. Alternatively, the window 200 may have a two-layered structure, and the visual line guidance sheet 300 may be placed between the two layers of the window 200.

Next, there will be described a configuration and functions of the controller 400. Functions of the controller 400 may be implemented by software, or alternatively, a part or all of the functions may be implemented by hardware. When the functions of the controller 400 are implemented by software, the controller 400 may be made up of a computer system incorporating a processor such as a CPU (Central Processing Unit) and a GPU (Graphics Processing Unit), and a memory, and the processor such as the CPU reads programs stored in advance in the memory and executes the programs, thereby implementing the functions of the object detector 401, the coordinate converter 402, and the light emission controller 403. When the functions are implemented by hardware, a custom IC such as an ASIC (Application Specific Integrated Circuit) and a programmable IC such as an FPGA (Field-Programmable Gate Array) may be used to constitute the controller 400, and then a circuit may be designed to implement those functions.

Figure 5:
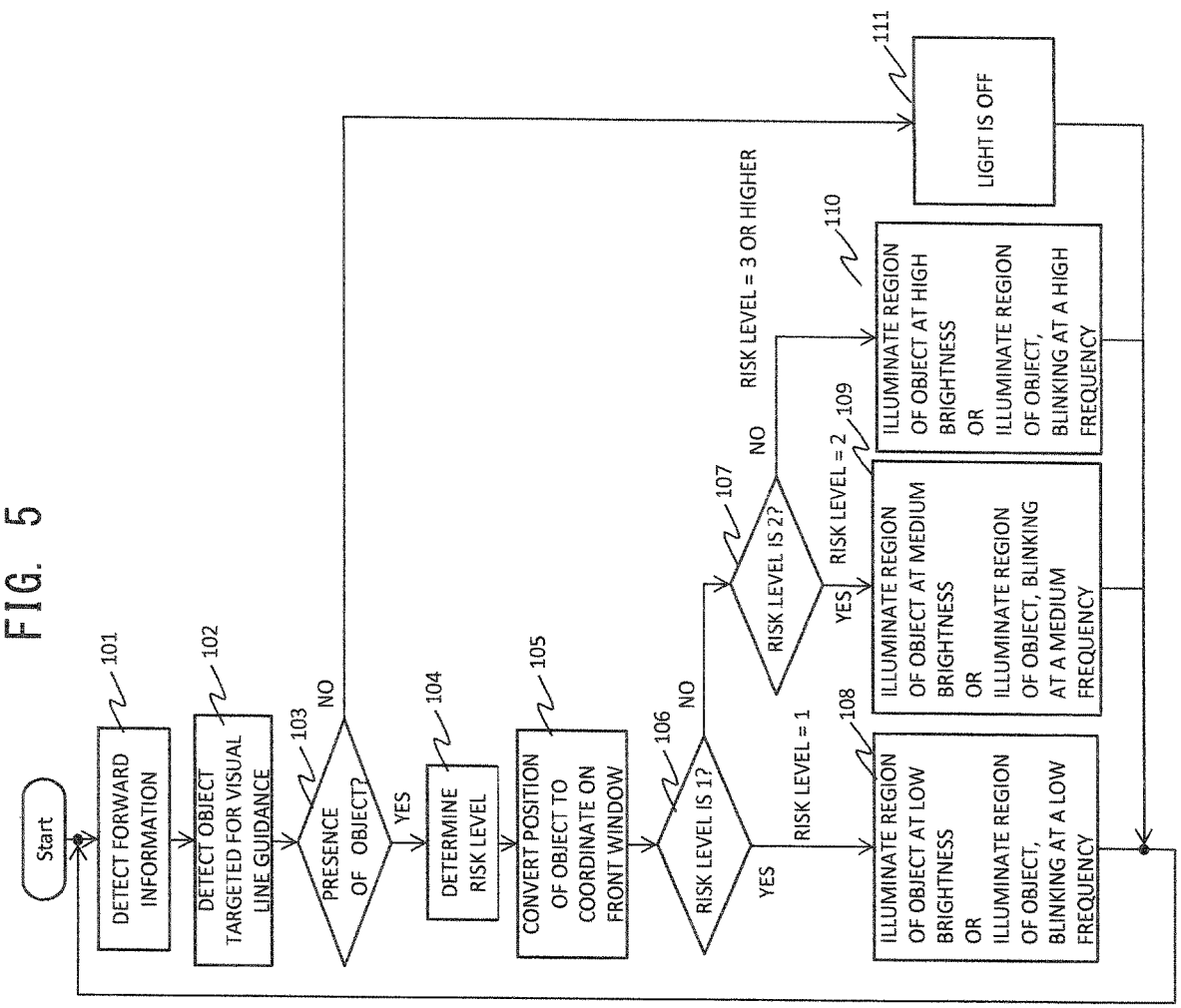
FIG. 5 is a flowchart showing operations of a controller in the visual line guidance system according to the first embodiment.
Figure 6:
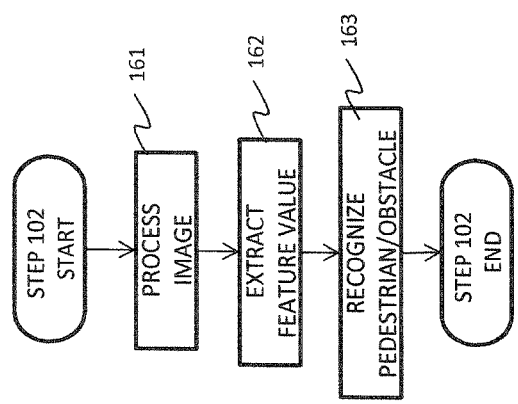
FIG. 6 is a flowchart showing operations of the controller in the visual line guidance system according to the first embodiment.

With reference to the flowcharts shown in FIGS. 5 and 6, operations of the controller 400 will be described. The object detector 401 of the controller 400 captures a forward image taken by the imager 500, in association with a region visible by the user 100 through the window 200, and detects forward information viewed by the user through the window (step 101).

A predetermined range may be set for the user's visible region through the window, or the range of the visible region may be accepted via an input unit, not illustrated, according to the user's operation. In addition, a sensor 600 for detecting a position of the user's eyes and a direction of the line of sight may be provided in proximity to the window 200 for the user to set the user's visible region in response to a detection result of the sensor 600.

When the imager 500 captures the forward image in a range larger than the user's visible region, the object detector 401 extracts an image within the user's visible region, out of the image received from the imager 500. When the imager 500 has a structure that allows adjustment of range and direction of imaging, the object detector 401 sets the user's visible region in the imager 500, and the imaging range and direction may be adjusted, so that the imager 500 can take an image of the user's visible region.

The object detector 401 processes the image received from the imager 500, thereby detecting a predetermined object targeted for visual line guidance, which is included in the image (step 102). The object targeted for visual line guidance may be, for example, a pedestrian, an oncoming vehicle, a vehicle traveling ahead, and an obstacle such as a utility pole. In this example here, the object detector 401 performs detection, assuming a pedestrian and an obstacle (utility pole) as the objects needing visual line guidance.

With reference to the flowchart of FIG. 6, the processing in step 102 according to the object detector 401 will be described further in detail.

The object detector 401 performs processing such as filtering and binarization on the image received from the imager 500, and detects an object included in the image (step 161). The object detector 401 extracts a feature value of thus detected object (step 162). Then, the feature value thus extracted is compared with a feature value of the object targeted for visual line guidance (e.g., pedestrian and obstacle (utility pole)), and a degree of matching is obtained by a function such as a cross-correlation function. Then, it is determined whether the detected object corresponds to the pedestrian or the obstacle (utility pole) (step 163). The feature value of the object may be a predetermined value such as shape and size, or a feature value extracted in advance by deep learning from a large number of images prepared for learning, where the feature value is commonly found in the object (pedestrian or obstacle (utility pole)) that needs the visual line guidance.

If the image received from the imager 500 includes the object targeted for visual line guidance (pedestrian or obstacle (utility pole)) (step 102), the object detector 401 performs the processing in the next step 104, and the level determiner 411 in the object detector 401 determines a risk level to which the object targeted for visual line guidance belongs.

The level determiner 411 determines a level of emphasis, on the basis of at least one of the following points; a position of the object targeted for visual line guidance in the image, a moving speed of the object, and a distance between the object and the window 200 or between the object and the user. In this example here, all those points are used for the determination, i.e., the position of the object targeted for visual line guidance, the moving speed of the object, and the distance between the object and the window 200 or between the object and the user.

The level determiner 411 obtains the distance a between the object targeted for visual line guidance detected in step 102 and the center of the image, and determines that the object is positioned in proximity to the center of the image, having a high risk level, when the distance a is shorter than a predetermined reference distance A.

The level determiner 411 receives the image in the previous step 101 and determines whether the object targeted for visual line guidance previously detected in step 102 is identical to the object targeted for visual line guidance currently detected in step 102. For example, the degree of matching is calculated between the feature value obtained in step 162 as to the object targeted for visual line guidance previously detected in step 102, and the feature value obtained in step 162 as to the object targeted for visual line guidance currently detected in step 102, and if the degree of matching is equal to or higher than a predetermined reference value, it is determined they are identical. Then, a difference (distance) between the position of the object previously detected in step 102 and the position of the object currently detected in step 102 is obtained. Then, this distance is divided by a time difference between the previous imaging point in step 101 and the current imaging point in step 101, thereby obtaining a travel speed v of the object. The level determiner 411 determines that the risk level of the object is high, when the travel speed v of the object is higher than a predetermined reference speed V.

The level determiner 411 receives from the distance sensor 700 being connected, a signal indicating the distance between the distance sensor 700 and the object or between the distance sensor and the user, and obtains the distance between the object and the window 200 or between the object and the user, by using the signal. When thus obtained distance 1 is smaller than the predetermined reference distance L, it is determined that the risk level of the object is high, indicating that the object is close to the window 200. By way of example, a TOF (Time of Flight) sensor is used as the distance sensor 700.

If any one of the following three items, i.e., the position of the object targeted for visual line guidance in the image, the travel speed of the object, and the distance between the object and the window 200 or between the object and the user, is determined as having the high risk level, it is judged that the object has the risk level 1. If two out of three items are determined as having the high risk level, it is judged that the object has the risk level 2, and if all of the three items are determined as having the high risk level, it is judged that the object has the risk level 3.

Next, the coordinate converter 402 of the controller 400 receives the position in the image, of the object targeted for visual line guidance (pedestrian or obstacle (utility pole)), the position being detected by the object detector 401 in step 102. Then, the coordinate converter obtains a region on the visual line guidance sheet, corresponding to the position of the object in the image, on the basis of the positional relationship between the window 200 and the visual line guidance sheet 300, received in advance from the user or via other methods (step 105).

Next, the light emission controller 403 of the controller 400 illuminates the LED dies 3 placed within the region corresponding to the object on the visual line guidance sheet, obtained by the coordinate converter 402 (steps 108 to 110). In this situation, all of the LED dies 3 within the region may illuminate, or as shown in FIG. 2B, only a part of the LED dies 3 within the region may illuminate, according to a predetermined rule. In the example as shown in FIG. 2B, when the object targeted for visual line guidance is the obstacle (utility pole), the LED dies 3 provided vertically in the column on the side closer to the center of the visual line guidance sheet 300 illuminate, out of the LED dies 3 within the region of the object. Alternatively, only the LED dies in proximity to the outline of the region may illuminate.

The light emission controller 403 receives the risk level of the object obtained by the level determiner 411 in step 104, checks the risk level, and controls luminous intensity (brightness) or frequencies of lighting on and off of the LED dies 3 (steps 106 and 107). In other words, when the received risk level is 1, the light emission controller 403 illuminates the LED dies 3 at a predetermined low brightness level, or at a low frequency (blinking slowly) (steps 106 and 108). When the object has the risk level 2, the light emission controller 403 illuminates the LED dies 3 at a predetermined medium brightness level, or at a medium frequency (blinking at medium speed) (steps 107 and 109). When the received risk level is 3, the light emission controller 403 illuminates the LED dies 3 at a predetermined high brightness level, or at a high frequency (blinking rapidly) (step 110). With this configuration, the higher is the risk level of the object, the brighter is the light emission from LED dies 3 or the more rapid is the blinking, thereby strongly drawing the user's attention, guiding the line of sight, and allowing the user to become aware of the presence of the object. The brightness level and the blinking speed of light on the LED dies 3 may be combined so as to draw the user's attention, in response to the risk level.

When no object targeted for visual line guidance is detected in step 102, the processing goes to the step 111 from the step 103, and lights of all the LED dies are turned off.

As discussed so far, according to the visual line guidance system 50 of the present embodiment, the user's eye can be drawn and guided to a hazardous object, and this increases visibility of the object or similar things.

When the user 100 drives a vehicle, and the window 200 corresponds to a windshield, the level determiner 411 may also capture a speed of its own vehicle in step 104, for judging the risk level.

In the aforementioned descriptions, the imager 500, a sensor 600 for detecting a direction of the line of sight, and the distance sensor 700 are not directly provided on the visual line guidance system 50, and images and signals are received from external imager 500, and so on. However, the present invention is not limited to this configuration. The visual line guidance system 50 may incorporate the imager 500, the sensor 600 for detecting a direction of the line of sight, and the distance sensor 700.

The visual line guidance sheet 300 may be described further in the following. The optically transparent substrate layer 1 is preferably a light transmissive substrate, and a material thereof may be, for example, glass, polystyrene (PS), polypropylene (PP), polycarbonate (PC), polyethylene terephthalate (PET), polyethylene naphthalate (PEN), and polyimide. By way of example, a thickness of the optically transparent substrate layer 1 may be 25 to 100 μm.

Ink containing conductive particles, is sintered by electromagnetic waves, thereby forming the wiring pattern 2. As the conductive particles, at least one of the conductive metal and conductive metal oxide such as Au, Ag, Cu, Pd, ITO, Ni, Pt, and Fe may be employed. In order to perform sintering by electromagnetic waves efficiently, it is desirable to enhance electromagnetic-wave absorbability of ink containing the conductive particles, and it is also desirable that a part or all of the conductive particles should be in a nano-sized form. By way of example, the size of the contained particle may be 10 to 150 nm.

There is employed as the LED die 3, an LED die that emits light having a wavelength suitable for enhancing visibility.

In FIGS. 3 and 4, there is shown an example where the wiring patterns 2 are formed on both sides of the optically transparent substrate layer 1, but the wiring patterns 2 may be formed only on the surface where the LED dies 3 are mounted.

In the present embodiment, the LED die 3 is bonded to the wiring pattern via electromagnetic sintering, and even when the optically transparent substrate layer 1 is bent and a distortion stress is applied, rupture or peeling may hardly occur at the joint, and therefore durability can be improved.

Furthermore, in the visual line guidance sheet 300, the wiring pattern 2 is directly mounted on the surface of the optically transparent substrate layer 1, heat generated when the LED die 3 illuminates can be thermally conducted efficiently via the wiring pattern 2, to the optically transparent substrate layer 1. This allows improvement of heat dissipation performance of the LED die 3.

<Production Method of the Visual Line Guidance Sheet According to the First Embodiment>

There will now be described the production method of the visual line guidance sheet 300. Firstly, with reference to FIGS. 7A to 7D, there will be described steps for forming the wiring pattern 2 on the optically transparent substrate layer 1, and bonding the LED die 3 thereto. An example will be described where electromagnetic waves are used as light for sintering of conductive particles.

Figure 7A:
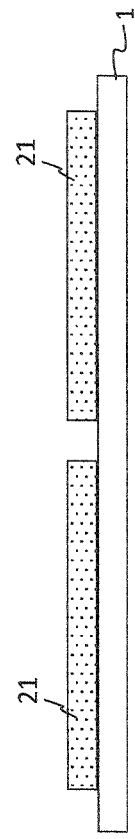
FIGS. 7A to 7D are cross-sectional views showing steps of producing the wiring pattern of the visual line guidance sheet according to the first embodiment.

As illustrated in FIG. 7A, a conductive paste where conductive particles are dispersed is prepared. The conductive paste may contain, in addition to a solvent and the conductive particles, a dispersant such as polyvinylpyrrolidone, resin, and so on. The conductive paste is applied to the surface of the optically transparent substrate layer 1 in the shape of a desired wiring pattern. As a method for applying the conductive paste, any of the methods may be employed, such as inkjet printing, dispensing, flexography, gravure printing, gravure-offset printing, and screen-printing method. According to the process above, a film 21 of the conductive particles is formed on the surface of the optically transparent substrate layer 1. The film 21 is heated if necessary, allowing the solvent to evaporate to dryness.

Figure 7B:
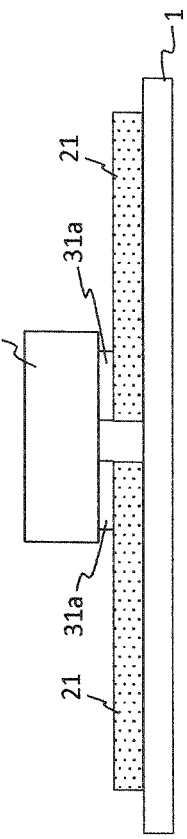
Figure 7C:
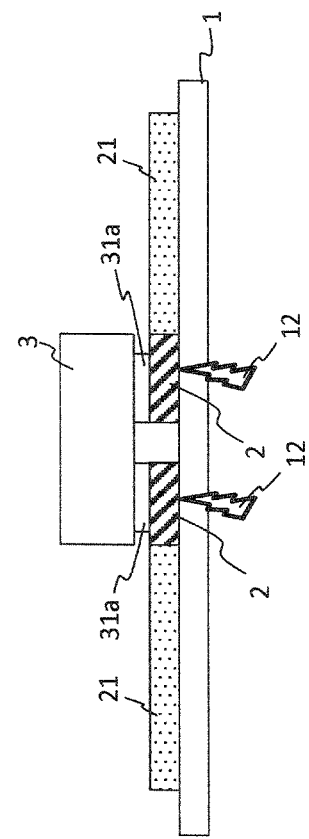
Figure 7D:
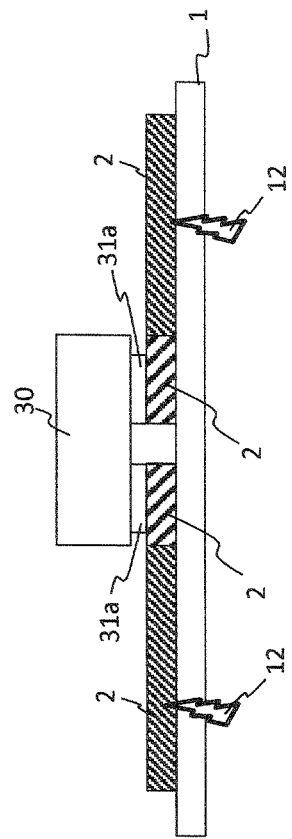

For sintering of the fine particles in the film 21 thus formed, only a wiring part is heated by locally irradiated with the electromagnetic waves, whereby the conductive particles undergo sintering. A pulse wave of light like a flash lamp, a continuous wave like laser light, and a long-wavelength electromagnetic wave like microwave, may be used as the electromagnetic wave. Firstly as shown in FIG. 7B, the LED die 3 is mounted on the unsintered wiring pattern 2, in a manner that its electrodes 31a come into contact with the film 21. Next, as shown in FIGS. 7C and 7D, the film 21 is irradiated with light beam 12 passing through the optically transparent substrate layer 1. According to this method, for example, forming of the wiring pattern 2, and connection between the LED die 3 and the wiring pattern 2 can be performed simultaneously or continuously, by the irradiation of the light beam 12. Specifically, as shown in FIG. 7C, regions between the electrodes 31a and the optically transparent substrate layer 1 are irradiated with the light beam 12 from the side of the optically transparent substrate layer 1 where the film 21 is not formed, and the wiring pattern 2 serving as an electrode-connection region is formed by optical sintering of the conductive particles in the film 21. With further irradiation of the light beam 12 as shown in FIG. 7D, the second wiring pattern 2 is also formed. As another formation sequence, the wiring pattern 2 serving as the electrode-connection region of the LED die 3 may be formed after forming the second wiring pattern.

It is also possible that after forming and sintering of the wiring pattern 2, ink containing conductive particles is further applied between the wiring pattern 2 and the electrodes 31a, and after mounting the electrodes 31a of LED die 3, the light beam 12 is further applied to form the electrode-connection region.

In the region irradiated with the light beam 12 on the film 21, the conductive particles absorb the light energy, causing a rise of the temperature of the region. Accordingly, the conductive particles melt at a temperature lower than a melting point of bulk material constituting the particles, and the melting conductive nanoparticles fuse with adjacent particles. Then, the conductive particles undergo sintering with one another, thereby forming the wiring pattern 2 on the upper surface of the optically transparent substrate layer 1. Then, the melting conductive particles are firmly adhered to the optically transparent substrate layer 1. In particular, the light beam 12 is applied from the side of the optically transparent substrate layer 1 where the film 21 is not formed, thereby increasing the adhesion strength of the interface between the optically transparent substrate layer 1 and the wiring pattern 2.

As described above, the temperature of the conductive particles in the film 21 within the region that is irradiated with the light beam 12, rises due to the light irradiation, and the heat caused by irradiation is used for sintering of the conductive particles, along with being conducted to a surrounding region of the film 21 and to the optically transparent substrate layer 1, and then, the heat is dissipated. Therefore, the temperature only within the region irradiated with the light beam 12 on the film 21, or only in the region irradiated with the light beam 12 and a region in the vicinity thereof, reaches a level that allows the conductive particles to undergo sintering. On the other hand, the temperature of the surrounding region on the film 21 and the temperature of the optically transparent substrate layer 1 may not be raised to a level that melts or changes properties of the constituent materials. In other words, in the present embodiment, only a partial region on the film 21 is irradiated with the light beam 12, thereby preventing the optically transparent substrate layer 1 from a rise in temperature, deformations or distortion, and property changes such as white turbidity caused by optical sintering of the optically transparent substrate layer 1. If the optically transparent substrate layer 1 is flexible, such flexible properties can be maintained.

In steps as shown in FIGS. 7C and 7D, it is desirable that thus formed wiring pattern 2 should become porous. In other words, the adjacent conductive particles are not completely melted to be mixed, but preferably, the contact interface undergoes electromagnetic sintering at a temperature that allows pores 40a to be formed at least partially between the conductive particles after the sintering is performed. By way of example, laser light is used as the light beam 12, and the film 21 is irradiated with the laser light at irradiation strength to the extent that it may not melt the optically transparent substrate layer 1 through which the light passes. Accordingly, this allows relatively large energy to be applied to the region on the film 21 that is irradiated with the light beam 12 within a short period of time, and the conductive particles can be heated and molten and undergo sintering. When irradiation of the light beam 12 of laser light is stopped, cooling is performed immediately due to thermal conduction to the surrounding region of the film 21 and to the optically transparent substrate layer 1, whereby a porous wiring pattern can be formed. In other words, when the light beam 12 of laser light performs sintering of the film 21, the irradiation strength of the light beam 12 can be controlled, so that the temperature of the film 21 becomes appropriate, enabling the porous wiring pattern 2 to be formed. As a specific example, a stretched polyethylene terephthalate (PET) film (the melting point is approximately 250° C. and the heat resistant temperature is approximately 150° C.) is used as the optically transparent substrate layer 1, the film 21 is irradiated with the light beam 12 of the laser light from the underside of the optically transparent substrate layer 1, with the strength controlled for maintaining the shape of the optically transparent substrate layer 1, and then the conductive particles of the film 21 undergo sintering. According to the process above, the porous wiring pattern 2 can be formed.

If the wiring pattern 2 is porous, the wiring pattern 2 itself is provided with followability (flexibility) as described above. Therefore, when the flexible optically transparent substrate layer 1 is deformed, the wiring pattern 2 follows the deformation, and thus the wiring pattern 2 may hardly peel off the optically transparent substrate layer 1, and also cracking or similar trouble may hardly occur. Therefore, it is possible to provide the visual line guidance sheet 300 being so flexible that disconnection is unlikely to occur.

In steps of FIGS. 7C and 7D, the light beam 12 applied to the film 21, may be adjusted in advance to the shape of the wiring pattern 2, via passing through a mask. Alternatively, the light beam 12 with an irradiation spot in a circular shape or a rectangular shape is made to scan, so as to depict the wiring pattern 2.

According to the steps as described above, the optically transparent substrate layer 1 on which the wiring pattern 2 and the LED die 3 are mounted can be formed.

It is of course possible to irradiate the optically transparent substrate layer 1 with the light beam 12, from the surface on the side where the film 21 is placed thereon. In this case, the light beam cannot be applied to the connection part of the electrodes for mounting the LED die 3, but the other part of the wiring pattern 2 can be sintered. Therefore, the step for forming the electrode connection part and the step for forming the wiring pattern may also be performed in parallel.

A wavelength that is absorbable by the conductive particles contained in the film 21 is used as the wavelength of the light beam (electromagnetic wave) 12 for irradiation. The irradiation light may be any of ultraviolet, visible, infrared light, and microwave. By way of example, if a material such as Ag, Cu, Au, and Pd is used for the conductive particles, light with the wavelength between or equal to 400 nm and 1,064 nm can be employed.

One or more of the following materials may be employed as the conductive particles; conductive metal such as Au, Ag, Cu, Pd, ITO, Ni, Pt, and Fe, and conductive metal oxide thereof. The conductive particles may include only nano-sized particles smaller than 1 μm in particle diameter (average diameter), or the nanosized particles of smaller than 1 μm and micro particles of 1 μm or larger in particle diameter (average diameter) may be mixed. Solvent may be organic solvent or water. Additives (such as polymer components) for improving dispersibility may be added to the solvent, and further, a resin component (such as epoxy, silicone, and urethane) may also be added thereto in order to improve adhesion.

Preferably, the thickness of the wiring pattern 2 may be twice or more larger than the width thereof, and more preferably, the thickness may be three-times or more larger than the width. The wiring pattern 2 should be formed in a size, for instance, 1 μm or more in width and 1 nm to 50 μm in thickness. An electrical resistance ratio of the wiring pattern 2 may preferably be $10^{-4}$ Ω·cm or less, and in particular, it is more preferable that the resistance should be low in the order of $10^{-6}$ Ω·cm.

In order to protect the LED die 3, a protective layer may be provided in a manner to cover the LED die 3, or at a predetermined distance from the LED die 3. As a material of the protective layer, for example, a resin material with light permeability, such as epoxy resin, silicone resin, urethane resin, and acrylic resin, may be employed.

Second Embodiment

With reference to FIG. 9, the second embodiment of the present invention will be described. A second aspect of the present invention is directed to a vehicle lighting apparatus equipped with the visual line guidance system 60.

As shown in FIG. 9, the vehicle lighting apparatus equipped with the visual line guidance system 60 of the present embodiment comprises at least a light source 61 for illuminating ahead of the vehicle 800, an imager 500 for taking an image ahead of the vehicle 800, and the visual line guidance system 50 for guiding a user's line of sight. The vehicle lighting apparatus 60 may further comprise an enclosure 62 provided with a light transparent part constituting a reflector and alight emitting surface of the vehicle lighting apparatus 60, the distance sensor 700, and the sensor 600 for detecting a direction of the user's line of sight. The light source 61, the distance sensor 700, and the imager 500 are incorporated in the enclosure 62.

The visual line guidance system 50 will not be described redundantly, since the detailed configuration thereof has been described in the first embodiment. The controller 400 of the visual line guidance system 50 receives an image from the imager 500 and a signal from the distance sensor 700, indicating the distance between the object and the distance sensor 700, the imager and the distance sensor being incorporated in the enclosure 62 with the light source 61. Then, the controller 400 detects the object targeted for visual line guidance, and illuminates the LED dies 3 in a region corresponding to the object on the visual line guidance sheet 300.

As discussed so far, in the present embodiment, with the visual line guidance system 50 configured to draw the user's eyes and to guide his or her line of sight, it is possible to provide the vehicle lighting apparatus capable of enhancing visibility of an object such as a hazardous object, thereby assisting in driving a vehicle.

Third Embodiment

Figure 10:
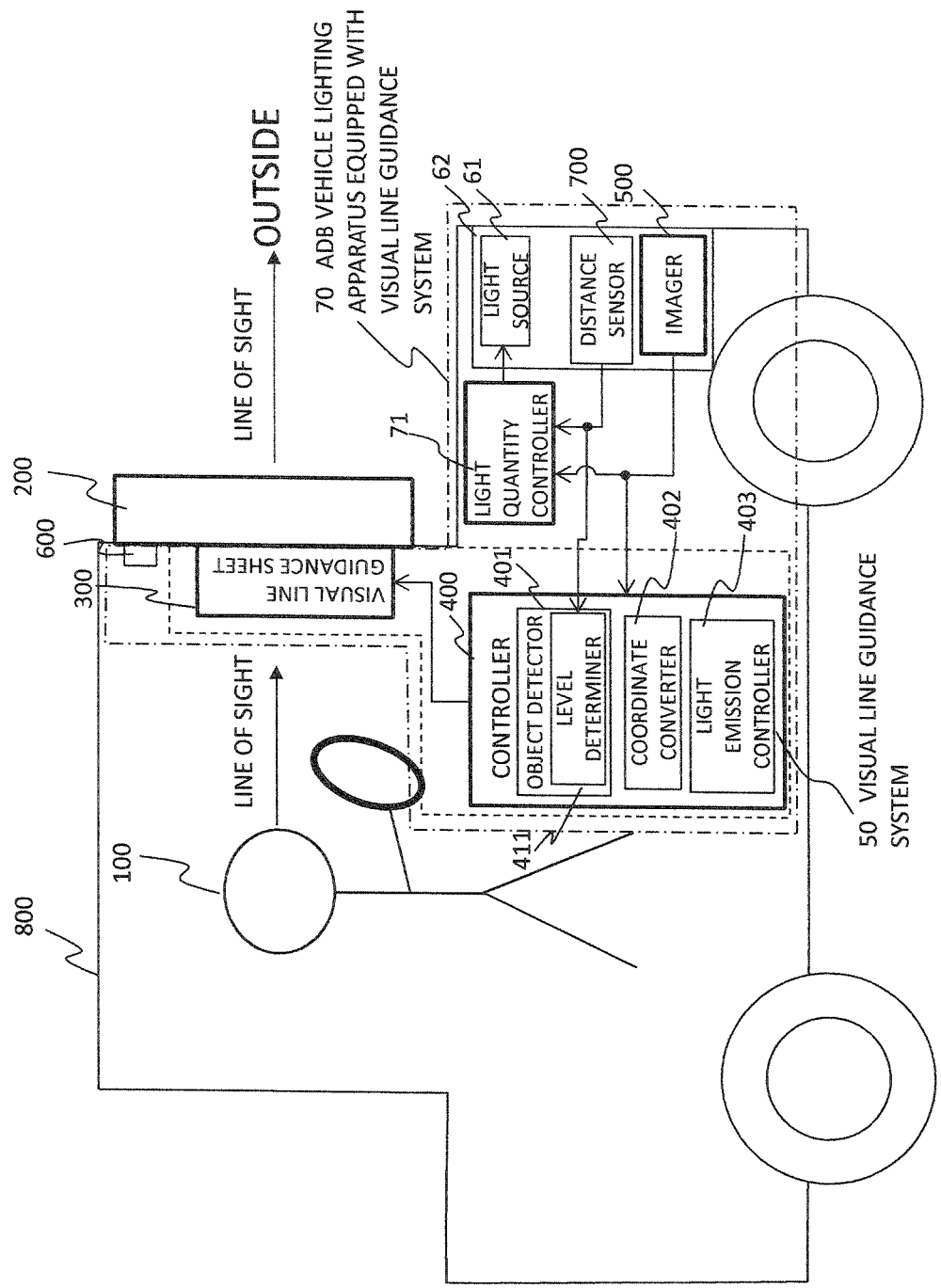
FIG. 10 is a block diagram showing an ADB (Adaptive Driving Beam) vehicle lighting apparatus incorporating the visual line guidance system according to a third embodiment.

With reference to FIG. 10, the third embodiment of the present invention will be described. The third aspect of the present invention is directed to an ADB vehicle lighting apparatus 70.

As shown in FIG. 10, the ADB vehicle lighting apparatus 70 of the present embodiment comprises at least the light source 61 for headlamps to illuminate ahead of the vehicle 800, the imager 500 for taking an image ahead of the vehicle 800, a light quantity controller 71, and the visual line guidance system 50 for guiding the user's line of sight. The headlamp light source 61 incorporates a plurality of light emitting elements in a two-dimensional array, for instance, with a configuration where on and off of each of the light emitting elements and a quantity of outgoing light are adjustable. The ADB vehicle lighting apparatus 70 may further comprise the enclosure 62 provided with the light transparent part constituting a reflector and a light emitting surface of the ADB vehicle lighting apparatus 70, the distance sensor 700, and the sensor 600 for detecting a direction of the user's line of sight. In FIG. 10, the light source 61, the distance sensor 700, and the imager 500 are incorporated in the enclosure 62.

The light quantity controller 71 performs processing on an image received from the imager 500, detects an object as to which a light quantity for illumination should be adjusted, and then, controls the light quantity in the direction of the object as to which the light quantity for illumination should be adjusted. With this configuration, only a desired forward area can be excluded from illumination of light, and a light beam illuminates another forward area, more intensively than the surrounding area, enabling illumination of ADB (Adaptive Driving Beam).

Figure 11:
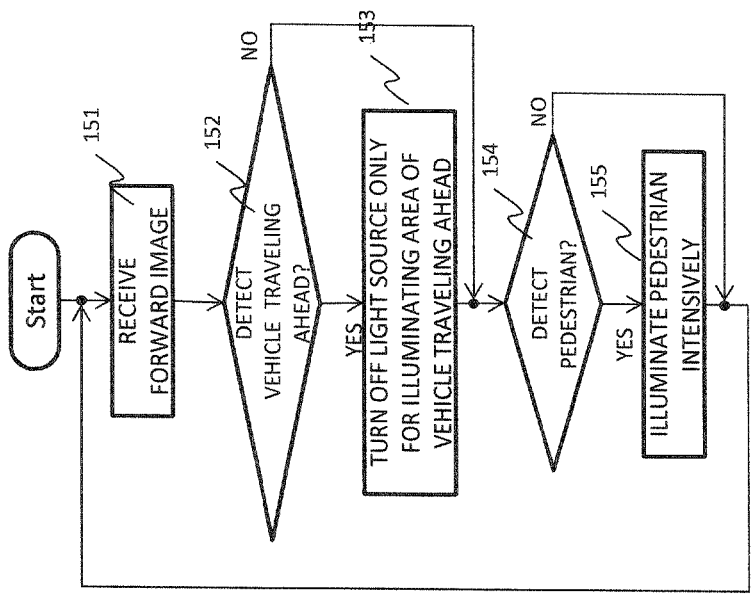
FIG. 11 is a flowchart showing operations of a light-source controller of the ADB vehicle lighting apparatus according to the third embodiment.
Figure 12B:
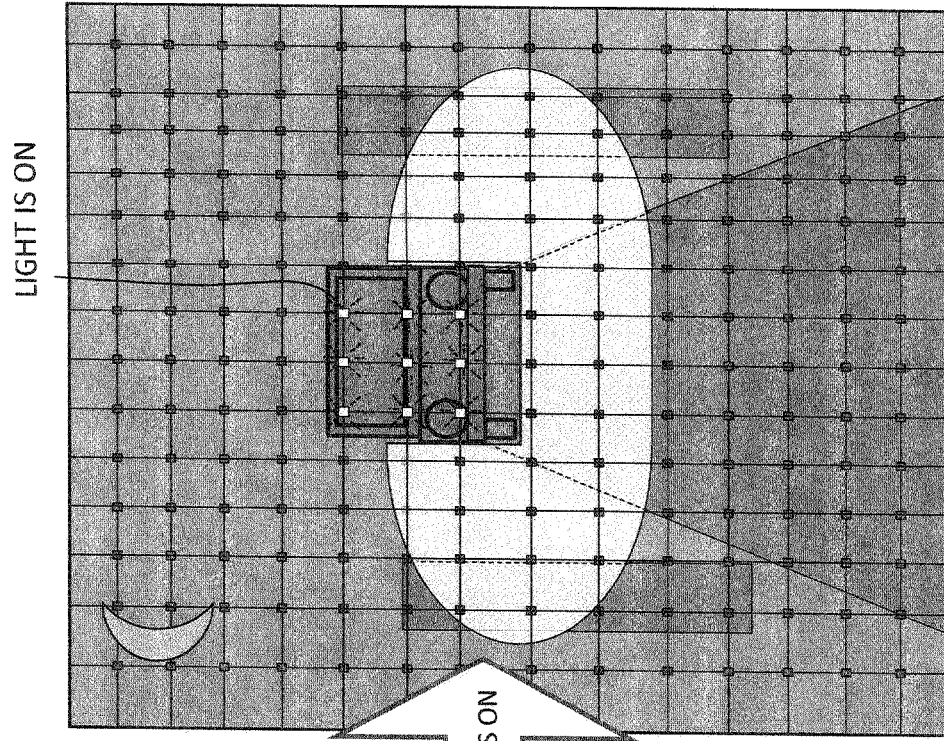
FIGS. 12A and 12B are front views showing a configuration of the visual line guidance sheet of the ADB vehicle lighting apparatus according to the third embodiment.
Figure 12A:
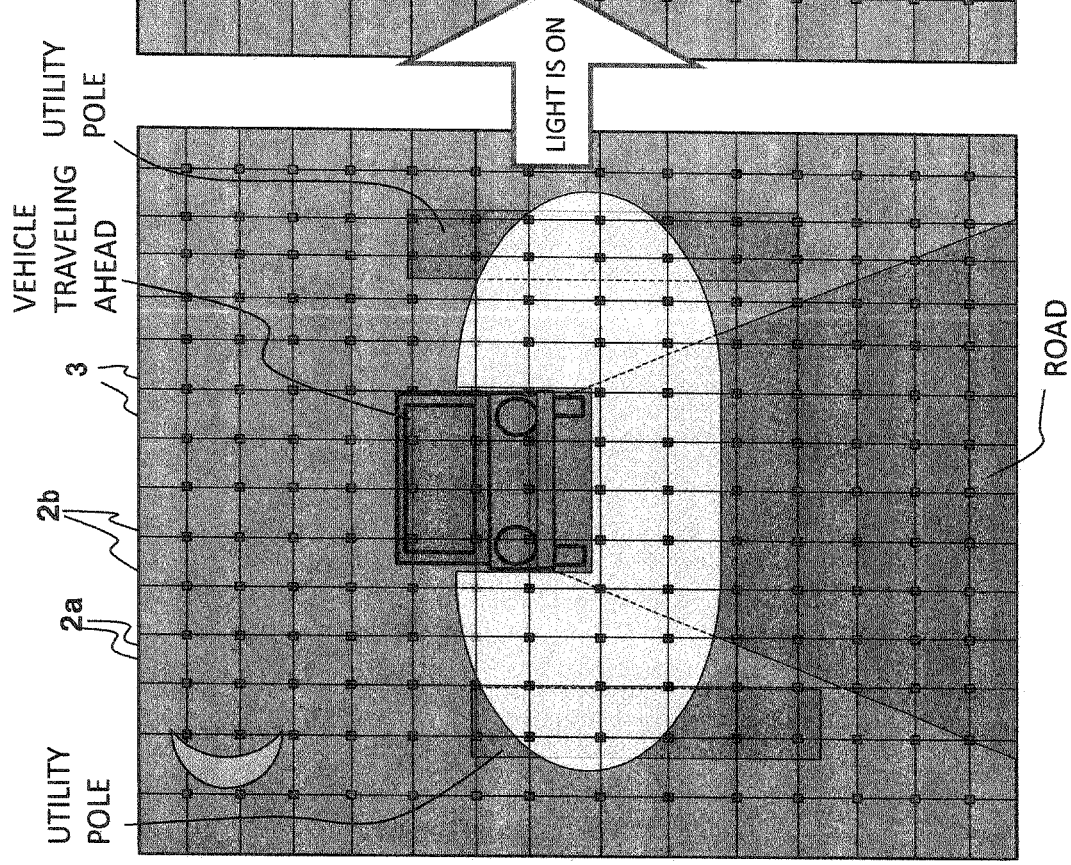

Specifically, as shown in the flowchart of FIG. 11, the light quantity controller 71 receives the forward image from the imager 500 (step 151) and detects a vehicle traveling ahead (step 152). A method for detecting the vehicle traveling ahead is the same as the method from steps 161 to 163 as shown in FIG. 6. That is, an object in the image is detected and a feature value thereof is obtained, and then it is determined whether the object corresponds to the vehicle traveling ahead, on the basis of a degree of matching between the obtained feature value and a predetermined feature value of the vehicle traveling ahead. When the vehicle traveling ahead is detected, the light emitting element illuminating the area where the vehicle traveling ahead is positioned is turned off as shown in FIG. 12A (step 153). This helps to eliminate glare for a driver in the vehicle traveling ahead. Next, the light quantity controller 71 determines whether the object in the image is a pedestrian, similar to the process of step 152, and detects the pedestrian (step 154). When the pedestrian is detected, the pedestrian is illuminated with intensive light beam, by a process such as increasing a supply of current to the light emitting element that illuminates the area where the pedestrian is positioned (step 155).

On the other hand, the visual line guidance system 50 has the same structure as described in the first embodiment, and for this case, it is configured to include at least either of the pedestrian and the vehicle traveling ahead, as the object targeted for visual line guidance. In steps 102 and 103 in FIG. 5, when the object targeted for visual line guidance (the pedestrian or the vehicle traveling ahead in this example) is detected, the risk level is determined in step 104. Then, the LED dies 3 illuminate in the region on the visual line guidance sheet 300, corresponding to the object targeted for visual line guidance (the pedestrian or the vehicle traveling ahead), according to the risk level (steps 106 to 110).

In FIG. 12A, the area of the vehicle traveling ahead is dark since the area is not exposed to the light beam from the headlamp light source 61, and it is hard for the user to recognize the vehicle traveling ahead. However, as shown in FIG. 12B, with the configuration as described above, the LED dies 3 in the visual line guidance sheet 300 illuminate, and this allows enhancement of visibility of the vehicle traveling ahead. As for the pedestrian, the pedestrian is exposed to the light beam from the headlamp light source 61 more intensively than the surroundings, and thus the pedestrian is emphasized. In addition, by turning on the light of the LED dies 3 in the visual line guidance sheet 300, visibility of the pedestrian may further be enhanced.

As described so far, according to the present embodiment, the ADB vehicle lighting apparatus can be provided, comprising the visual line guidance system 50 that draws the user's eyes and guides the line of sight, thereby enhancing visibility of an object such as a hazardous object, and assisting in driving a vehicle.

In the third embodiment, the light quantity controller 71 may serve also as the object detector 401 of the visual line guidance system 50. In this case, the coordinate converter 402 of the visual line guidance system 50 receives from the light quantity controller 71, an object as to which the light quantity should be adjusted, and assuming this object as the object targeted for visual line guidance, the coordinate converter 402 obtains a region on the visual line guidance sheet 300, corresponding to a position of the object in the image. Then, the light emission controller 403 turns on the LED dies 3 within the region thus obtained.

With the configuration where the light quantity controller 71 serves also as the object detector 401, the configuration of the visual line guidance system 50 can be simplified.

As discussed above, in the configuration of the first embodiment, the user's line of sight is guided to the object in the image that is visible through the window 200 by the user. However, the window 200 is not limited to a vehicle windshield in the front, but a rear window or a side window may be used as the window 200. In addition, the present invention is not limited to an example of the vehicle, but a window of any other transport machine such as a train and an aircraft.

In the present embodiment, the object targeted for visual line guidance is not limited to a hazardous object or an obstacle. By way of example, user's eyes may be drawn to a certain building for the purpose of tour guidance.

Furthermore, the present embodiment is not limited to a configuration to guide the user's line of sight to an object within the image taken by the imager 500, but the object may be the image itself. Therefore, the present invention is also applicable to the visual line guidance to draw the user's eyes toward an object included in an image that is displayed in a movie, TV program, a game machine, pachinko machine, and the like.

What is claimed is:

1. A visual line guidance system comprising:
    a visual line guidance sheet arranged to cover at least a part of a window for a user to look out therethrough, with a light emitting region to guide the user's line of sight, and a controller configured to control the light emitting region on the visual line guidance sheet, wherein:
    the visual line guidance sheet comprises an optical transparency substrate layer, a plurality of LED dies mounted on the optical transparency substrate layer, and a wiring pattern provided on a surface of the optical transparency substrate layer and bonded to the LED dies, and
    the controller comprises an object detector configured to receive from an imager, an image of a region visible by the user through the window, and to process the image thus received, so as to detect a predetermined object targeted for visual line guidance, included in the image, a coordinate converter configured to obtain a region on the visual line guidance sheet, corresponding to a position of the object in the image, and a light emission controller configured to emit light from the LED dies placed within thus obtained region on the visual line guidance sheet.

2. The visual line guidance system according to claim 1, wherein the plurality of LED dies are arranged spaced apart both vertically and horizontally.

3. The visual line guidance system according to claim 2, wherein the wiring pattern comprises a vertical wiring pattern and a horizontal wiring pattern, each of the LED dies is placed at or in proximity to an intersection of the vertical wiring pattern and the horizontal wiring pattern, and the plurality of LED dies are supplied with current individually.

4. The visual line guidance system according to claim 1, wherein the wiring pattern is obtained by sintering of conductive particles.

5. The visual line guidance system according to claim 4, wherein no resin is contained in the wiring pattern.

6. The visual line guidance system according to claim 5, wherein the plurality of LED dies are arranged spaced apart both vertically and horizontally.

7. The visual line guidance system according to claim 4, wherein the plurality of LED dies are arranged spaced apart both vertically and horizontally.

8. The visual line guidance system according to claim 4, wherein:
    the controller further comprises a level determiner configured to determine a risk level the object belongs to, among a plurality of risk levels for visual line guidance, according to a predetermined criterion of judgment, and
    the light emission controller at least one of a luminous intensity and a blinking speed of the plurality of LED dies, according to a result of the judgment by the level determiner.

9. The visual line guidance system according to claim 4, wherein the object detected by the object detector includes any one of a pedestrian, a vehicle, and an obstacle.

10. The visual line guidance system according to claim 4, wherein:
    at least one of Au, Ag, Cu, Pd, ITO, Ni, Pt, and Fe is used as a material of the conductive particles, and
    the conductive particles comprise nanosized particles smaller than 1 μm and micro particles of 1 μm or larger in particle diameter.

11. The visual line guidance system according to claim 1, wherein:
    the controller further comprises a level determiner configured to determine a risk level the object belongs to, among a plurality of risk levels for visual line guidance, according to a predetermined criterion of judgment, and
    the light emission controller controls at least one of a luminous intensity and a blinking speed of the plurality of LED dies, according to a result of the judgment by the level determiner.

12. The visual line guidance system according to claim 11, wherein the level determiner determines the risk level based on at least one of a position of the object targeted for visual line guidance in the image, a distance between the object and the window, and a moving speed of the object.

13. The visual line guidance system according to claim 12, wherein the level determiner is connected to a distance sensor, and receives a signal indicating a distance between the distance sensor and the object or between the distance sensor and the user, and obtains the distance between the object and the window.

14. The visual line guidance system according to claim 1, wherein the object detected by the object detector includes any one of a pedestrian, a vehicle, and an obstacle.

15. The visual line guidance system according to claim 1, further comprising the imager.

16. A vehicle lighting apparatus comprising a light source for illuminating ahead of a vehicle, an imager for taking an image ahead of the vehicle, and a visual line guidance system for guiding a user's line of sight, wherein:
   the visual line guidance system is the visual line guidance system according to claim 1, and
   the visual line guidance sheet of the visual line guidance system is arranged to cover at least a part of a windshield of the vehicle, and the controller of the visual line guidance system receives, from the imager, an image of a region visible by the user through the windshield.

17. The visual line guidance system according to claim 16, wherein the wiring pattern is obtained by sintering of conductive particles.

18. An Adaptive-Driving-Beam vehicle lighting apparatus comprising a light source for illuminating ahead of a vehicle, an imager for taking an image ahead of the vehicle, a light quantity controller for processing the image to detect an object as to which a light quantity for illumination is to be adjusted, and controlling the light quantity in a direction of the object as to which the light quantity for illumination is to be adjusted, and a visual line guidance system for guiding a user's line of sight, wherein:
   the visual line guidance system is the visual line guidance system according to claim 1, and
   the visual line guidance sheet of the visual line guidance system is arranged to cover at least a part of a windshield of the vehicle, and the controller of the visual line guidance system receives from the imager, an image of a region visible by the user through the windshield.

19. The Adaptive-Driving-Beam vehicle lighting apparatus according to claim 18, wherein:
   the light quantity controller serves also as the object detector of the visual line guidance system, and
   the coordinate converter of the visual line guidance system receives the object in the image as to which the light quantity for illumination is to be adjusted, being detected by the light quantity controller, and assuming the thus obtained object as the object targeted for visual line guidance, obtains a region on the visual line guidance sheet corresponding to a position of the object in the image.

20. A vehicle comprising a windshield, a light source for illuminating ahead of the vehicle, an imager for taking an image ahead of the vehicle, a light quantity controller for processing the image to detect an object as to which a light quantity for illumination is to be adjusted, and controlling the light quantity in the direction of the object as to which the light quantity for illumination from the light source is to be adjusted, and a visual line guidance system for guiding a driver's line of sight, wherein:
   the visual line guidance system is the visual line guidance system according to claim 1, and
   the visual line guidance sheet of the visual line guidance system is arranged to cover at least a part of the windshield, and the controller of the visual line guidance system receives from the imager, an image of a region visible by the driver through the windshield.

* * * * *